(12) United States Patent
Uchiyama et al.

(10) Patent No.: US 6,831,313 B2
(45) Date of Patent: Dec. 14, 2004

(54) FERROELECTRIC COMPOSITE MATERIAL, METHOD OF MAKING SAME AND MEMORY UTILIZING SAME

(75) Inventors: Kiyoshi Uchiyama, Colorado Springs, CO (US); Carlos A. Paz de Araujo, Colorado Springs, CO (US); Vikram Joshi, Colorado Springs, CO (US); Narayan Solayappan, Colorado Springs, CO (US); Jolanta Celinska, Colorado Springs, CO (US); Larry D. McMillan, Colorado Springs, CO (US)

(73) Assignees: Symetrix Corporation, Colorado Springs, CO (US); Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/332,481

(22) PCT Filed: May 9, 2002

(86) PCT No.: PCT/US02/14888

§ 371 (c)(1),
(2), (4) Date: Jul. 22, 2003

(87) PCT Pub. No.: WO02/091473

PCT Pub. Date: Nov. 14, 2002

(65) Prior Publication Data

US 2004/0129987 A1 Jul. 8, 2004

Related U.S. Application Data

(63) Continuation-in-part of application No. 09/852,895, filed on May 10, 2001, now abandoned, and a continuation-in-part of application No. 10/092,812, filed on Mar. 7, 2002, now abandoned.

(51) Int. Cl.$^7$ ............................................. H01L 29/72
(52) U.S. Cl. ....................... 257/295; 257/296; 257/395; 257/396
(58) Field of Search ............................... 257/295, 296, 257/395, 396

(56) References Cited

U.S. PATENT DOCUMENTS

6,365,927 B1 * 4/2002 Cuchiaro et al. ........... 257/295

FOREIGN PATENT DOCUMENTS

| EP | 1039525 A1 | 9/2000 |
| WO | WO 00/67331 A1 | 11/2000 |

OTHER PUBLICATIONS

Gan, B. K., et al., "Lead Zirconate Titanate–Barium Titanate By Mechanical Activation Of Mixed Oxides," Applied Physics A Materials Science & Processing, Oct. 1999, Springer–Verlag, Germandy, vol. A69, No. 4, pp. 433–436, XP002214963,ISSN: 0947–8396.

Tejedor, P. et al., Composition–related effects of microstructure on the ferroelectric behavior of SBT thin films,: 10$^{th}$ International Conference On Solid Films, and Surfaces, Princeton, NJ, USA 9–3 Jul. 2000, vol. 175–176, pp. 759–763, XP002214964, Applied Surface Science, May 15, 2001, Elsevier, Netherlands, ISSN: 0169–4332.

Das–Gupta, D. K. et al., "Ferroelectric ceramic/polar polymer composite films for pyroelectric sensors," 6$^{th}$ International Conference On Dielectric Materials, Measurements And Applications (Conf. Publ. No. 363), Manchester, UK, Sep. 7–10, 1992, pp. 393–396, XP001112924 1992, London, UK, IEE, UK, ISBN 0–85296–551–8.

* cited by examiner

Primary Examiner—Edward Wojciechowicz
(74) Attorney, Agent, or Firm—Patton Boggs LLP

(57) ABSTRACT

A ferroelectric memory (436) includes a plurality of memory cells (73, 82, 100) each containing a ferroelectric thin film (15) including a microscopically composite material having a ferroelectric component (18) and a dielectric component (19), the dielectric component being a different chemical compound than the ferroelectric component. The dielectric component is preferably a fluxor, i.e., a material having a higher crystallization velocity than the ferroelectric component. The addition of the fluxor permits a ferroelectric thin film to be crystallized at a temperature of between 400° C. and 550° C.

14 Claims, 4 Drawing Sheets

FERROELECTRIC COMPOSITE MATERIAL, METHOD OF MAKING SAME AND MEMORY UTILIZING SAME

RELATED APPLICATIONS

This application is a continuation-in-part application of U.S. application Ser. No. 09/852,895, filed May 10, 2001, now abandoned, and application Ser. No. 10/092,812 filed Mar. 7, 2002, now abandoned.

BACKGROUND OF THE INVENTION

1. Field of the Invention

This invention relates to ferroelectric materials and memories utilizing such materials, and more particularly to such a material and memory which can be made at relatively low temperatures.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, Jul. 1998, pp. 22–27. Such memories are based on the fact that ferroelectrics can be polarized when a voltage is placed across them. By reversing the direction of the voltage, the polarization can be reversed, which provides a bistable electronic element that is ideally suited for digital electronics. The non-votatility derives from the fact that the polarization remains after the voltage is removed.

For years, the objective of making such a ferroelectric memory was blocked by the fact that all known ferroelectrics fatigued; that is, the polarizability decreased by a factor of two or more as the ferroelectric was switched. In 1991, a material, now called a layered superlattice material, was discovered which did not fatigue. See, U.S. Pat. No. 5,519,234 issued on May 21, 1996 to Araujo et al. Because this was a new material in the integrated circuit fabrication industry, and because ferroelectrics memory architecture was relatively undeveloped as compared to, for example, dynamic random access memories (DRAMs) and Flash memories, it has taken about nine years to solve all the problems that need to be solved to produce a memory that would be competitive with conventional memories. There remains yet one significant problem: ferroelectrics are ceramics, and it requires relatively high heat, on the order of 650° C. to 850° C., to crystallize them. Conventional memory materials, such as doped silicon, silicon dioxide, aluminum, tungsten, titanium, etc. are somewhat sensitive to temperature, and thus integration of the ferroelectrics into the conventional processes remains problematic.

Numerous attempts have been made to overcome the temperature problem. See, U.S. patent application Ser. No. 5,508,226 issued on Apr. 16, 1996 to Takeshi Ito et al., U.S. Pat. No. 6,133,092 issued Oct. 17, 2000 to Shinichiro Hayashi et al., and U.S. Pat. No. 5,962,069 issued Oct. 5, 1999 to Gunther Shindler et al. While the thermal budget to which the partially completed memory is exposed has been significantly lowered by these advances, heat still remains the principle hurdle to the high yields that are necessary to make ferroelectric memories as economical to manufacture as memories such as DRAMs.

SUMMARY OF THE INVENTION

The invention solves the above problem by providing a composite ferroelectric material that also has good ferroelectric performance. The material is a composite of a ferroelectric component and a dielectric component, which is preferably a fluxor.

The invention preferably comprises a ferroelectric integrated circuit memory which includes a ferroelectric thin film comprising a ferroelectric component and a fluxor. The fluxor is a material that has a higher crystallization velocity than the ferroelectric component. It is possible the fluxor is another ferroelectric with a higher crystallization velocity than the principal ferroelectric component, but preferably the fluxor is a dielectric material, and most preferably a single metal oxide or a solid solution of a plurality of single metal oxides. The fluxor can include some carbonate that carries through from the precursor, but the amount of carbon should be limited.

The invention also provides a precursor for making a composite ferroelectric material. The precursor preferably comprises a metalorganic compound in a solvent, the metal organic compound including metals in the amounts required to form the above-mentioned composite ferroelectric material upon heating of the precursor.

Preferably, the composite ferroelectric comprises a microscopic mixture of ferroelectric domains and dielectric domains. The ferroelectric domains and dielectric domains are preferably distributed essentially homogeneously distributed in the material. Thus the material comprises small ferroelectric crystals separated by a dielectric medium.

The invention also provides a low temperature method of making a ferroelectric thin film. The method comprises providing a metal organic compound including metals in the proportions required to form a microscopically composite ferroelectric/fluxor material.

The invention not only provides a ferroelectric material and memory which can be made at low temperatures, but also provides such a material and memory with excellent electronic properties, and which is economical to manufacture. Numerous other features, objects and advantages of the invention will become apparent from the following description when read in conjunction with the accompanying drawings.

DETAILED DESCRIPTION OF THE PREFERRED EMBODIMENT

1. Introduction

Figure 1:
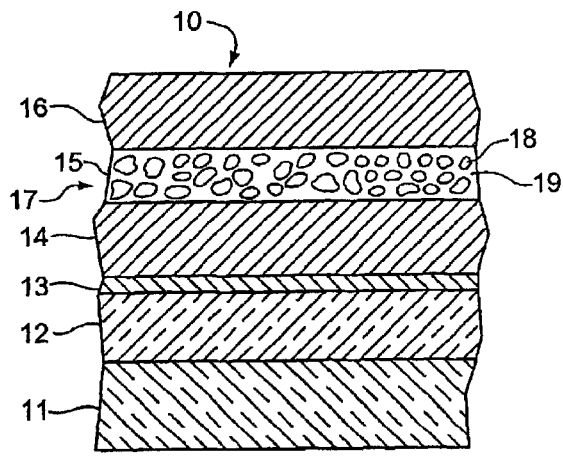
FIG. 1 is a portion of a cross-section of a ferroelectric integrated circuit illustrating a thin film capacitor device according to the invention.

Directing attention to FIG. 1, a portion of a cross-section of a capacitor 17 on a wafer 10 is shown. The wafer 10 includes a substrate 11, insulator 12, adhesion layer 13, bottom electrode 14, ferroelectric layer 15, and top electrode 16. Substrate 11 is preferably silicon, but may also be any other semiconductor, such as germanium, gallium arsenide, silicon germanium, etc. If the layer 11 is silicon, then insulating layer 12 is preferably silicon dioxide. Preferably adhesion layer 13 is titanium, which assists the next layer, which is preferably platinum 14, in adhering to the silicon dioxide 12. However, adhesion layer 13 and electrode 14 may also be made of a conducting oxide or other suitable conductors. Ferroelectric layer 14 is a thin film of microscopically composite ferroelectric material 15, and electrode 16 is also preferably platinum, but may also be other metal or conductive material. After the layers 11, 12, 13, 14, 15, and 16 are deposited, the wafer is etched down to layer 14 to form the individual capacitors, such as 17, which are interconnected by the bottom electrode 14. The invention primarily involves the method of creating the microscopically composite ferroelectric thin-film layer 15, which comprises ferroelectric domains 18 separated by a dielectric component 19, which is preferably a fluxor, and most preferably a simple oxide or solid solution of simple oxides. Here, "microscopically composite" means that the ferroelectric domains are microscopic, that is smaller than about 10 microns ($10^{-5}$ meters) in size, and preferably smaller than a few nanometers, and is intended to exclude structures that are made by separately forming layers of different materials. The material 15 is a composite material as the terms "composite" and "material" are conventionally used in chemistry. That is, the different domains of a composite material form spontaneously in the same process, and are not individually and independently fabricated. An essential feature of a composite is that the materials of the composite are atomically different and are not simply different parts of a crystal structure that is conventionally considered a single material.

Ferroelectric domains 18 are preferably layered superlattice materials or $ABO_3$ type materials. Layered superlattice materials comprise complex oxides of metals, such as strontium, calcium, barium, bismuth, cadmium, lead, titanium, tantalum, hafnium, tungsten, niobium, zirconium, bismuth, scandium, yttrium, lanthanum, antimony, chromium, and thallium that spontaneously form layered superlattices; i.e. crystalline lattices that include alternating layers of distinctly different sublattices. Generally each layered superlattice material will include two or more of the above metals; for example, barium, bismuth and niobium form the layered superlattice material barium bismuth niobate, $BaBi_2Nb_2O_9$.

The layered superlattice materials, also referred to in the art as layered perovskite-like structures, are represented by the general formula:

$$A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_{z}^{-q}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc.

The superscripts in Formula (1) indicate the valences of the respective elements. For example, if Q is O for oxygen, then q is 2. The subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary throughout the crystalline material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include the cases where the A- and B-sites and the superlattice generator sites of the crystalline material can be occupied by more than one type of atom.

The value of z is found from the equation:

$$(a1w1+a2w2 \ldots +ajwj)+(s1 \times +s2 \times 2 \ldots +sk \times k)+(b1y1+b2y2 \ldots +blyl)=qz. \quad (2)$$

Formula (1) includes all three of the Smolenskii type compounds. The layered superlattice materials do not include every material that can be fit into the Formula (1), but only those which spontaneously form themselves into crystalline structures with distinct alternating layers.

The layered superlattice materials do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates self-ordering of the superlattice-forming moieties into thermodynamically favored structures, such as perovskite-like octahedra. The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a non-perovskite-like bismuth oxide layer.

Formula (1) at least includes all three of the Smolenskii-type ferroelectric layered superlattice materials, namely, those having the respective formulae:

$$A_{m-1}S_2B_mO_{3m+3}; \quad (3)$$

$$A_{m+1}B_mO_{3m+1}; \text{ and} \quad (4)$$

$$A_mB_mO_{3m+2}, \quad (5)$$

wherein A is an A-site metal in the perovskite-like superlattice, B is a B-site metal in the perovskite-like superlattice, S is a trivalent superlattice generator metal such as bismuth or thallium, and m is a number sufficient to balance the overall formula charge. Where m is a fractional number, the overall average empirical formula provides for a plurality of different or mixed perovskite-like layers.

It should also be understood that the term "layered superlattice material" herein also includes doped layered superlattice materials. That is, any of the material included in Formula (1) may be doped with a variety of materials, such as silicon, germanium, uranium, zirconium, tin or hafnium. For example, strontium bismuth tantalate may be doped with a variety of elements as given by the formula:

$$(Sr_{1-w}M1_w)(Bi_{1-x}S_x)_2(Ta_{1-y}M2_y)_2O_9 + \alpha M3O, \quad (6)$$

where M1 may be Ca, Ba, Mg, or Pb, S is a superlattice generator selected from the group consisting of Y, Sc, La, Sb, Cr, Tl and mixtures thereof, M2 may be Nb, Bi, or Sb, with w, x and y being a number between 0 and 1, M3 may be Si, Ge, U, Zr, Sn, or Hf, and preferably $0 \leq \alpha \leq 0.05$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-z) Sr(Bi_{1-x}S_x)_2Ta_2O_{9+zABO3}, \quad (7)$$

where A may be Bi, Sr, Ca, Mg, Pb, Y, Ba, Sn, and Ln; B may be Ti, Zr, Hf, Mn, Ni, Fe, and Co; and z is a number between 0 and 1, preferably, $0 \leq z \leq 0.2$.

Likewise the layered superlattice material may be modified by both a minor $ABO_3$ component and a dopant. For example, a material according to the formula:

$$(1-z) Sr(Bi_{1-x}S_x)_2Ta_2O_9 + zABO_3, + \alpha MeO, \quad (8)$$

where A may be Bi, Sb, Y and Ln; B may be Nb, Ta, and Bi, Me may be Si, Ge, U, Ti, Sn, and Zr; and z is a number between 0 and 1, preferably, $0 \leq z \leq 0.2$, is contemplated by the invention. For further descriptions of a layered superlattice material, please see U.S. Pat. No. 5,519,234 issued May 21, 1996 to Paz de Araujo et al.; U.S. Pat. No. 5,434,102 issued Jul. 18, 1995 to Watanabe et al.; U.S. Pat. No. 5,784,310 issued Jul. 22, 1998 to Cuchiaro et al.; and U.S. Pat. No. 5,840,110 issued Nov. 24, 1998 to Azuma et al.

In some discussions in the literature, a subset of the layered superlattice materials is referred to as bismuth layered perovskites or simply bismuth layered materials. These materials are often summarized under the formula:

$$(Bi_2O_2)^{2+}(A_{m-1}B_mO_{3m+1})^{2-} \quad (9)$$

where $A=Na^+$, $K^+$, $Pb^{2+}$, $Bi^{3+}$ and other A-site elements mentioned above, $B=Fe^{3+}$, $Ti^{4+}$, $Nb^{5+}$, $Ta^{5+}$, and $W^{6+}$ and other B-site elements mentioned above, and m is generally an integer equal to zero or greater, though it can also be fractional. This formulation is sometimes preferred because it separates the components of the oxide layers and the perovskite-like layers. when m=1, the formula reduces to $(Bi_2O_2)^{2+}(BO_4)^{2-}$, for example, $Bi_2WO_6$. The m=1 materials are particularly favored for forming the matrix component of the composite.

The $ABO_3$ type materials are well-known simple oxides having a perovskite crystalline structure, and include materials such as lead zirconium titanate (PZT), lead lanthanum zirconium titanate (PLZT) as well as many other materials. It is noted that a material such as PZT is a solid solution of three different simple perovskite oxides.

The dielectric component is preferably a fluxor, i.e., a material that has a higher crystal growth velocity than the ferroelectric material. The higher velocity of crystallization generally results from the fact that the material has a higher diffusion rate, which is generally related to the viscosity in the liquid at the melting point. For a discussion of crystal growth velocity and its relationship to diffusion rate and viscosity see *Fundamentals of Inorganic Glasses*, by A. K. Varshneya, ISBN 0-12-714970-8, pp. 48-54, (1994). The fluxor can include ferroelectric materials, having a higher crystal growth velocity than the basic ferroelectric. Herein, a "basic-ferroelectric" means the ferroelectric component in the composite that has an appropriately high polarizability in the thin film composite state so as to provide the polarizability properties desired to produce the ferroelectric device. Most preferably the fluxor is a simple oxide or a solid solution of simple oxides. A partial list of such fluxor materials includes: $B_2O_3$, $SiO_2$, $GeO_2$, $P_2O_5$, $As_2O_3$, $Sb_2O_3$, $In_2O_3$, $Tl_2O_3$, $SnO_2$, $PbO$, $SeO_2$, $TeO_2$, $MoO_3$, $WO_3$, $Bi_2O_3$, $Al_2O_3$, $Ba_2O_3$, $V_2O_5$, $MgO$, $SO_3$, $CaO$, $ZnO$, $BeO$, $Rb_2O$, $La_2O_3$, $ThO_2$, $Ta_2O_5$ and $Ti_2O$ and combinations thereof, i.e., solid solutions thereof. In the precursor state, the fluxor metal will preferably be in a carbonate compound and some of the carbonate may transfer to the ferroelectric composite material, but the amount of this carbonate should be kept small. The dielectric material may also be an $ABO_3$ type oxide, a layered superlattice material, or high temperature plastics such as polymides.

Figure 2:
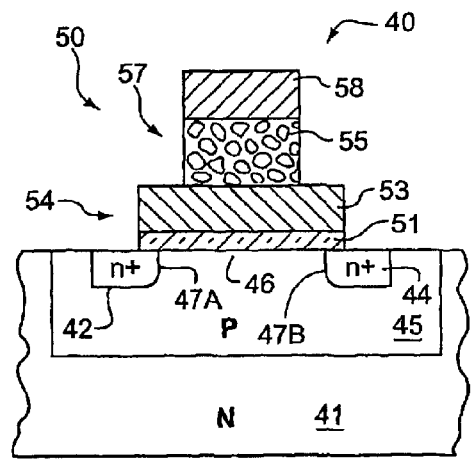
FIG. 2 shows a cross-sectional view of a preferred embodiment of a ferroelectric FET according to the invention.

Turning to FIG. 2, a cross-sectional view of a ferroelectric FET (FeFET) 40 that may be used in a memory according to the invention is shown. FeFET 40 is conventionally known as a metal-ferroelectric-metal-insulator-semiconductor (MFMIS) field effect transistor (FET). Another common FeFET that may be used is a metal-ferroelectric-insulator-semiconductor FeFET (MFISFET). Many other types of FeFETs may be used. FeFET 40 includes a substrate 41 which is preferably n-type silicon, but may be p-type silicon or any other appropriate semiconductor, such as gallium arsenide, silicon germanium, and others. A well 45, preferably a p-type well, is formed within substrate 41. Doped active areas 42 and 44, preferably n-type, are formed in well 45. We shall generally refer to these active areas 42 and 44 herein as source/drains since they can either be a source or a drain depending on the relative voltages applied to the areas. In certain portions of this disclosure, the voltages applied to these areas indicate that one is a source and the other is a drain; in these portions, we will then refer to them specifically as either a source or a drain. A channel region 46, preferably also n-type, but not as highly doped as source/drains 42 and 44, is formed between source/drains 42 and 44. A gate structure 50 is formed on substrate 41 above channel region 46. In the preferred embodiment, gate structure 50 is a multilayer structure, though it may not include all the layers 51 through 58 shown in FIG. 2, and may include additional layers as known in the art. That is, gate structure 50 shown in FIG. 2 is intended to illustrate the layers that could be included in the structure. The fundamental layers involved are an insulating layer 51, a floating gate layer 53, a composite ferroelectric layer 55, and a gate electrode layer 58. Insulating layer 51, often referred to as the "gate oxide", may be a multilayer structure, each layer of which is a different insulator. It may include an insulator closely related to the material of semiconductor 41, a buffer layer that can perform one or both of two functions: assisting in the adhesion of the layers above it to the layer below it; and preventing the migration of elements in the layers above it to the layers below it, and another material having dielectric properties suitable for effective operation of the FeFET. See, for example, U.S. patent application Ser. No. 09/385,308 filed Aug. 30, 1999. A floating conducting gate 53 is formed on insulating layer 51. Again, the floating gate may include multiple layers. A ferroelectric layer 55 is formed on floating gate 52. A gate electrode 58 is formed on ferroelectric layer 55. It should be understood that ferroelectric layer 55 and gate electrode 58 can also be multilayer structures, though generally they are not. Wiring layers (see FIG. 8) form electrical contacts to source/drains 42, 44, gate electrode 58, and P-well 45. As shown in the drawing, in the preferred embodiment, the area of the capacitive element 54 comprising floating gate 53 and gate insulator 51 is greater than the area of the capacitive element 54 comprising ferroelectric layer 55 and gate electrode 58 to enhance the voltage drop across ferroelectric 55. See U.S. patent application Ser. No. 09/329,670 filed Jun. 10, 1999, and U.S. patent application Ser. No. 09/365,628 filed Aug. 2, 1999.

Preferably, when semiconductor 41 is silicon, insulating layer 51 is silicon dioxide. Preferably, it may also comprise $CeO_2$, $Ta_2O_5$, $SiO_2$, $ZrO_2$, $Y_2O_3$, $YMnO_2$, and $SrTa_2O_6$. Ferroelectric 55 is a composite material, such as described above. Floating gate 53 and gate 58 are preferably made of platinum, though they may be polysilicon or any other suitable conductor. As known in the art, floating gate 53, which is sometimes referred to in the art as the bottom electrode, may be a multilayer structure which may include an adhesive layer depending on the embodiment. The adhesion layer is typically titanium and preferably approximately 20 nm thick. The layer above the adhesion layer is preferably an approximately 100–200 nm thick, layer of platinum. Floating gate 53 may also include a barrier layer, which typically is $IrO_2$, preferably about 4 nm to 40 nm thick. The only essential parts of FET 40 are semiconductor 41, ferroelectric layer 55 and gate 58. The other layers are optional. One or more may be omitted in any specific embodiment. Further, the order of layers 51-58 may be varied, and additional layers may be added.

Figure 3:
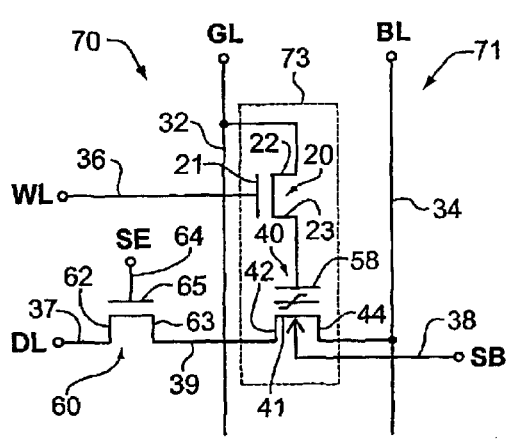
FIG. 3 is an electrical circuit diagram showing the essential elements of a memory cell utilizing the invention and the connection of the elements to the signal lines.

Directing attention to FIG. 3, a simplified, one-cell memory 70 according to the invention is shown for illustrative purposes. Memory 70 includes memory array 71, a read transistor 60, a select line 64, and a drain line input 37. Memory array 71 includes a memory cell 73, a gate line 32, a bit line 34, a word line 36, a substrate line 38, and a drain line 39. Memory cell 73 includes an erase/write switching device 20, and a ferroelectric field effect transistor (FeFET) 40, such as that shown in FIG. 2. Erase/write switching device 20 may be a diode, a Schottky diode, a pair of back-to-back diodes or other electronic switch, but preferably is a transistor, which we shall refer to herein as an erase/write transistor 20. Transistor 20 is referred to as an "erase/write" switching device to indicate that it functions during the erase and write operations, but does not function during the read operation. Transistor 20 is preferably a conventional transistor such as a MOSFET. Read transistor 60, which is a conventional transistor, and preferably a MOSFET, forms part of the peripheral address circuitry and is not part of memory cell 73. Word line 36 is connected to gate 21 of write transistor 20. Gate line 32 is connected to one source/drain 22 of transistor 20 and the other source/drain 23 is connected to gate 58 of FeFET 40. One source/drain 42 of FeFET 40 is connected to one source/drain of transistor 60. The other source/drain 44 of FeFET 40 is connected to bit line 34. The other source/drain 62 of transistor 60 is connected to the drain line input 37. Select line 64 is connected to gate 65 of transistor 60.

In the operation of memory 79, a signal WL is applied to word line 36, a signal GL is applied to gate line 32, a signal BL is applied to and/or generated on bit line 34, a signal SB is applied to gate source line 38, a signal DL is applied to drain line input 37, and a signal SE is applied to select line 64. As known in the art, a ferroelectric memory using the cell of FIG. 3 will normally comprise an array of rows and columns of such cells.

Figure 5:
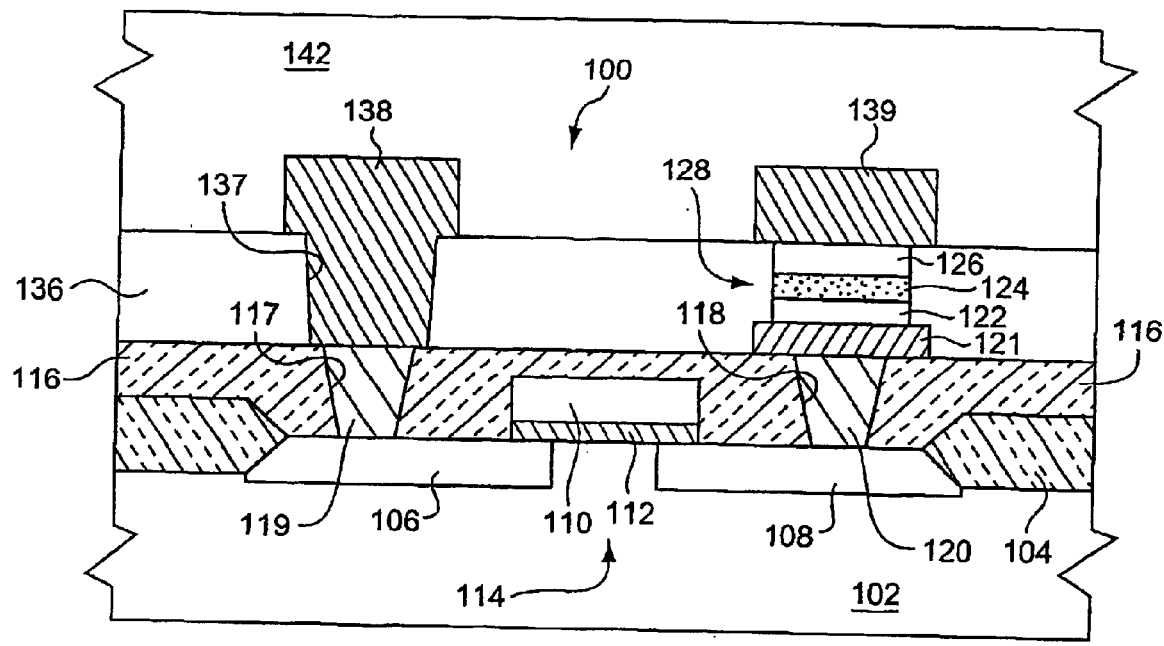
FIG. 5 is a cross-sectional view of a memory cell of a further alternative memory in which the invention can be utilized.

It should be understood that FIGS. 1 and 5 depicting integrated circuit devices are not meant to be actual plan or cross-sectional views of any particular portion of an actual integrated circuit device. In the actual devices, the layers will not be as regular and the thickness will generally have different proportions. The figures instead show idealized representations which are employed to more clearly and fully depict the structure and process of the invention than would otherwise be possible. For example, if the various thickness of the layers were correct relative to one another, the drawing of the FeFET could not fit on the paper.

Terms of orientation herein, such as "above", "over", "top", "upper", "below", "bottom" and "lower", mean relative to semiconductor substrate 11 or 41. That is, if a second element is "above" a first element, it means it is farther from substrate 11 or 41, and if it is "below" another element then it is closer to substrate 11 or 41 than the other element. The long dimension of substrate 11 or 41 defines a substrate plane that is defined by the horizontal direction and the direction into and out of the paper in FIGS. 1 and 2. Planes parallel to this plane are called a "horizontal" plane herein, and directions perpendicular to this plane are considered to be "vertical". A memory cell typically comprises relatively flat thin film layers. The terms "lateral" or "laterally" refer to the direction of the flat plane of the thin film layers. In FIG. 2, the lateral direction would be the horizontal direction. The terms "underlie" and "overlie" are also defined in terms of substrate 11 or 41. That is, if a first element underlies a second overlying element, it means that a line perpendicular to the substrate plane that passes through the first element also passes through the second element. The term "between" does not mean that the buffer layer is in direct contact with the thin film of ferroelectric material or the semiconductor. The layer "between" other layers may contact the layers it is between, but typically, it does not. The term "on" is sometimes used in the specification when referring to the deposition or formation of an integrated circuit layer onto an underlying substrate or layer. In contrast to "between", the term "on" generally signifies direct contact, as is clear in the various contexts in which it is used.

In this disclosure, the terms "row" and "column" are relative terms that are used to facilitate the disclosure. That is, conventionally, a row is a horizontal line or alignment and a column is a vertical line or alignment. However, the invention contemplates that in any array, rows can become columns and columns can become rows simply by viewing the array from a perspective that is rotated by 90 degrees, 270 degrees, etc. Thus, because a memory architecture is rotated by 90 degrees, 270 degrees, etc., from the invention described in the summary of the invention, the specification, or claims herein, but otherwise is the same, does not take it outside of the architectures contemplated by the invention.

Figure 4:
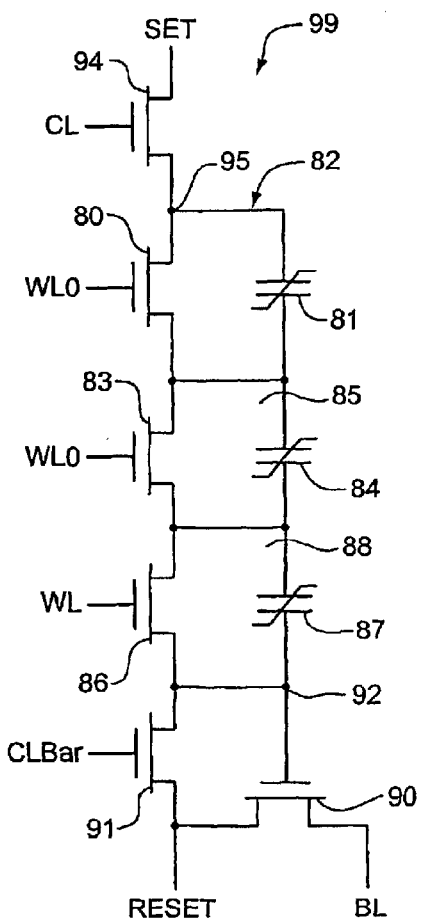
FIG. 4 is an electrical circuit diagram showing a one column array of another memory in which the invention can be utilized.

Another ferroelectric memory architecture in which a ferroelectric memory device according to the invention can be used is shown in FIG. 4. This is sometimes referred to as a linked cell structure. The basic memory cell 82 consists of one switch 80 which preferably is a MOSFET transistor 80, in parallel with a ferroelectric capacitor 81. FIG. 4 shows a 3×1 linked cell structure, which can be considered as a one-column array 99. Transistor 80 and ferroelectric capacitor 81 form cell 82; transistor 83 and ferroelectric capacitor 84 form a second cell 85; transistor 86 and ferroelectric capacitor 87 form a third cell 88. The three cells 82, 85 and 88 form a column of memory cells. Transistor 89 is a transistor used for reading. Transistor 91 controls whether the Reset signal is applied to node 92 or not. Transistor 92 control whether Set signal is applied to node 95 or not. The above three transistors, 90, 91, and 94, are the control transistors, which can all be replaced by other more complicated circuits to improve the performance. That is, they can be considered as part of the peripheral circuit. An actual ferroelectric memory utilizing this architecture will normally have more than three linked cells in a column and will have many columns of cells.

FIG. 5 shows a cross-sectional view of a portion of another exemplary nonvolatile integrated circuit ferroelectric memory cell 100 that can be fabricated according to the invention. The general manufacturing steps for fabricating such integrated circuits containing MOSFETs and ferroelectric capacitor elements are described in Mihara, U.S. Pat. No. 5,466,629 and Yoshimori, U.S. Pat. No. 5,468,684. General fabrication methods have been described in other references also. Therefore, the elements of the circuit of FIG. 5 will be simply identified here.

In FIG. 5, a field oxide region 104 is formed on a surface of a substrate 102, which is preferably silicon, but may also be other semiconductors, such as gallium arsenide, germanium, silicon germanium, etc. A source region 106 and a drain region 108 are formed separately from each other within silicon substrate 102. A gate insulating layer 110 is formed on the silicon substrate 104 between the source and drain regions 106 and 108. Further, a gate electrode 112 is formed on the gate insulating layer 110. These source region 106, drain region 108, gate insulating layer 110 and gate electrode 112 together form a MOSFET 114.

A first interlayer dielectric layer (ILD) 116, preferably made of BPSG (boron-doped phosphosilicate glass) is formed on substrate 104 and field oxide region 102. ILD 116 is patterned to form vias 117, 118 to source region 106 and drain region 108, respectively. Vias 117, 118 are filled to form plugs 119, 120, respectively. Plugs 119, 120 are electrically conductive and typically comprise polycrystalline silicon. A diffusion barrier layer 121 is formed and patterned on ILD 116 to be in electrical contact with plug 120. The diffusion barrier layer 121 is made of, for example, titanium nitride, and typically has a thickness of 10–20 nm. Diffusion barrier layers, such as titanium nitride, inhibit the diffusion of chemical species between the underlying and overlying layers of the memory 100.

As depicted in FIG. 5, a bottom electrode layer 122, preferably made of platinum and having a thickness of 90 nm, is deposited on diffusion barrier layer 121. Then a ferroelectric thin film 124 is formed on bottom electrode layer 122. According to the invention, the ferroelectric thin film 124 is a composite material and is preferably 80 nanometers (nm) or less thick. Most preferably, it is 50 nanometers or less. A top electrode layer 126, preferably made of platinum and having a thickness of 90 nm, is formed on the ferroelectric thin film 124. Bottom electrode layer 122, ferroelectric thin film 124 and top electrode layer 126 together form ferroelectric capacitor 128. The method of formation of ferroelectric film 124 is discussed in detail below.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer (ILD) 136 made of NSG (non-doped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136.

ILD 136 is patterned to form a via 137 to plug 119. A metallized wiring film is deposited to cover ILD 136 and fill via 137 and then patterned to form plug 137, source electrode wiring 138, and top electrode wiring 139. Wirings 138, 139 preferably comprise Al—Si—Cu standard interconnect metal with a thickness of about 200–300 nm.

FIGS. 1–5 depict only a few of many variations of ferroelectric memory elements and cells that can use the structure and method of the invention. The ferroelectric material 124 is incorporated into an active component in the integrated circuit portion 100. An active component of an integrated circuit memory is a component that is actively involved in the memory function, as contrasted to a component, such as insulator 136 which serves only to separate active components from one another.

The word "substrate" can mean the underlying wafer 11, 41, 102 on which the integrated circuit is formed, as well as any object on which a thin film layer is deposited, such as BPSG layer 116. In this disclosure, "substrate" shall mean the object to which the layer of interest is applied; for example, when we are talking about a bottom electrode, such as 122, the substrate includes the layers 121 and 116 on which the electrode 122 is formed.

The term "thin film" is used herein as it is used in the integrated circuit art. Generally, it means a film of less than a micron in thickness. The ferroelectric thin films disclosed herein generally have a thickness not exceeding 0.08 microns, or 80 nanometers. Preferably, the ferroelectric thin film 124 is 30 nm to 90 nm thick. These thin films of the integrated circuit art should not be confused with the layered capacitors of the macroscopic capacitor art, which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. In this disclosure, an "excess" amount of a metallic element means an amount greater than required to bond with the other metals present to make a completed crystalline structure of the desired material, with all atomic sites occupied and no amount of any metal left over. A "deficient" amount of a metallic element means an amount less than required to bond with the other metals if the other metals were present in stoichiometrically balanced amounts.

Figure 9:
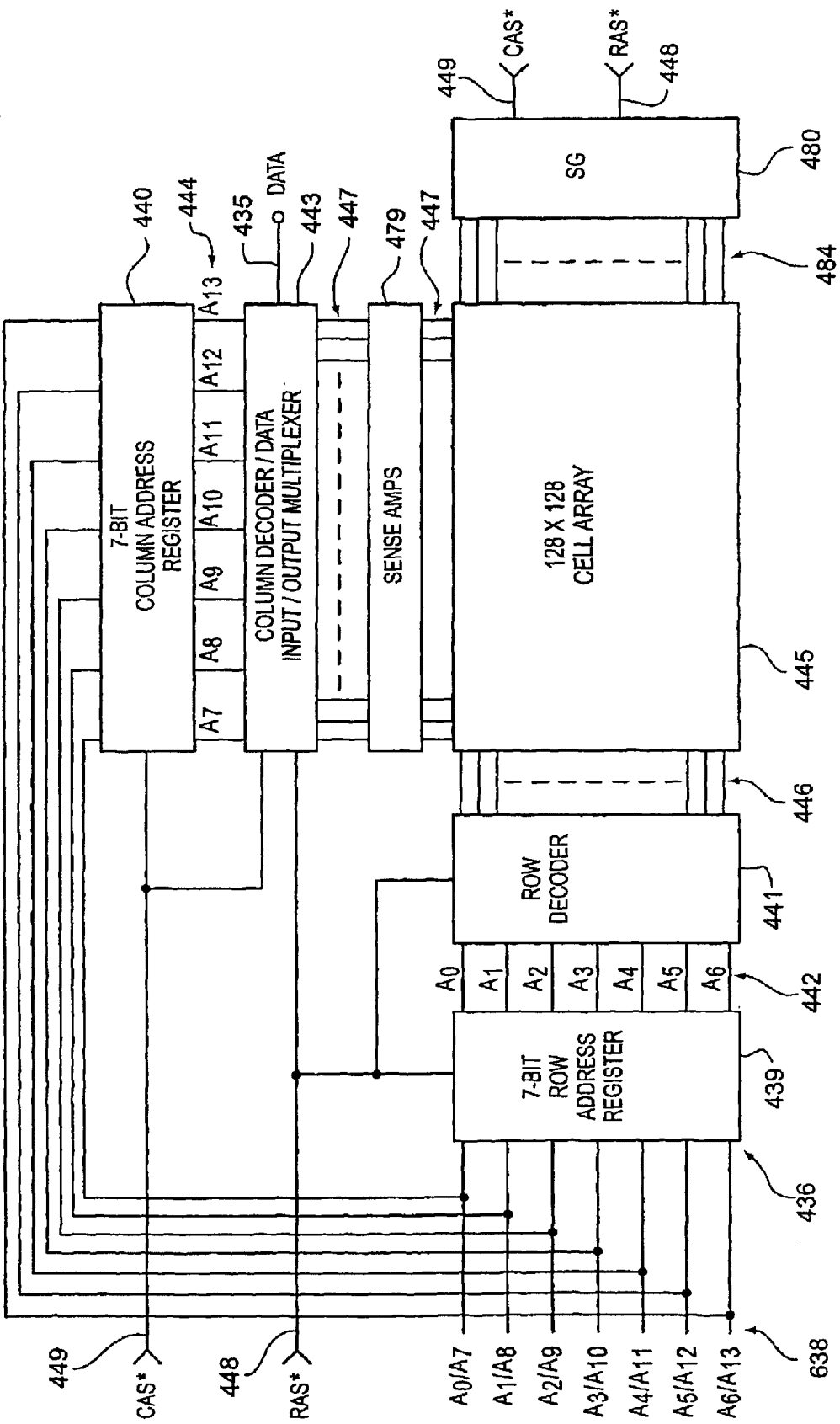
FIG. 9 is an illustration of how a memory array of memory cells according to the invention can be incorporated into a non-volatile ferroelectric memory.

FIG. 9 is a block diagram illustrating an exemplary integrated circuit memory 436 in which memory arrays, such as 99, according to the invention are utilized. Memory 436 is presented only to place the various portions of the invention described above within the context of the memory art, and as an illustration of a possible application of the electronics described above. Those skilled in the art will recognize that many other applications are possible. For simplicity, the embodiment shown is for a 16K×1 FeRAM; however, the material may be utilized in a wide variety of sizes and types of memories. In the 16K embodiment shown, there are seven address input lines 438 which connect to a row address register 439 and a column address register 440. Row address register 439 is connected to row decoder 441 via seven lines 442, and column address register 440 is connected to a column decoder/data input/output multiplexer 443 via seven lines 444. Row decoder 441 is connected to a 128×128 memory cell array 445 via 128 lines 446, and column decoder/data input/output multiplexer 443 is connected to sense amplifiers 479 and memory cell array 445 via 128 lines 447. A signal generator 480 is connected to array 445 via up to 256 lines 484. A RAS* signal line 448 is connected to row address register 439, row decoder 441, column decoder/data input/output multiplexer 443, and signal generator 480, while a CAS* signal line 449 is connected to column address register 440, column decoder/data input/ output multiplexer 443, and signal generator 480 (In the discussion herein, a* indicates the inverse of a signal.) An input/output data line 435 is connected to column decoder/ data input/output multiplexer 443.

Memory cell array 445 contains 128×128=16,384 memory cells, which is conventionally designated as 16K. These cells are ferroelectric switching capacitor-based cells such as 73, 82, or 100. Lines 446 correspond to the word lines, such as 36. Lines 447 correspond to the gate and bit lines, such as 32 and 34.

The operation of the memory in FIG. 9 is as follows. Row address signals $A_0$ through $A_6$ and column address signals $A_7$ through $A_{13}$ placed on lines 438 are multiplexed by address registers 439, 440 utilizing the RAS* and CAS* signals, and passed to row decoder 441 and column decoder/ data input/output multiplexer 443, respectively. Row decoder 441 places the word line signals, such as the WLn signals discussed above on the one of the word lines 446 corresponding to the cell that is addressed. Column decoder/ data input/output multiplexer 443 either places the data signal which is input on line 435 on the one of the gate lines 447 corresponding to the column address, or outputs on the data line 435 the signal on the one of the bit lines 447 corresponding to the column address, depending on whether the function is a write or read function. These are the gate line signal, PLm, and the bit line signal, BLm, discussed above. As is known in the art, the read function is triggered when the RAS* signal precedes the CAS* signal, and the write function is triggered when the CAS* signal comes before the RAS* signal. As is well-known in the art, sense amplifiers 479 are located along lines 447 to amplify the signals on the lines. The drain and substrate signals, such as DLn and SBn signals discussed above, are produced by signal generator 480 based on the CAS* and RAS* signals and an internal chip clock. In some memories, signal generator 480 and row decoder 441 may be combined into a single signal generation unit. The circuitry of row decoder 441 and signal generator 480 includes all circuitry required to produce the word line, drain line, and substrate signals discussed above. This circuitry is known in the art of integrated circuit memory design, and will not be further discussed herein. Other logic required or useful to carry out the functions outlined above as well as other known memory functions is also included in memory 436 but is not shown or discussed as it is not directly applicable to the invention.

2. Detailed Description of the Fabrication Process

Figure 10:
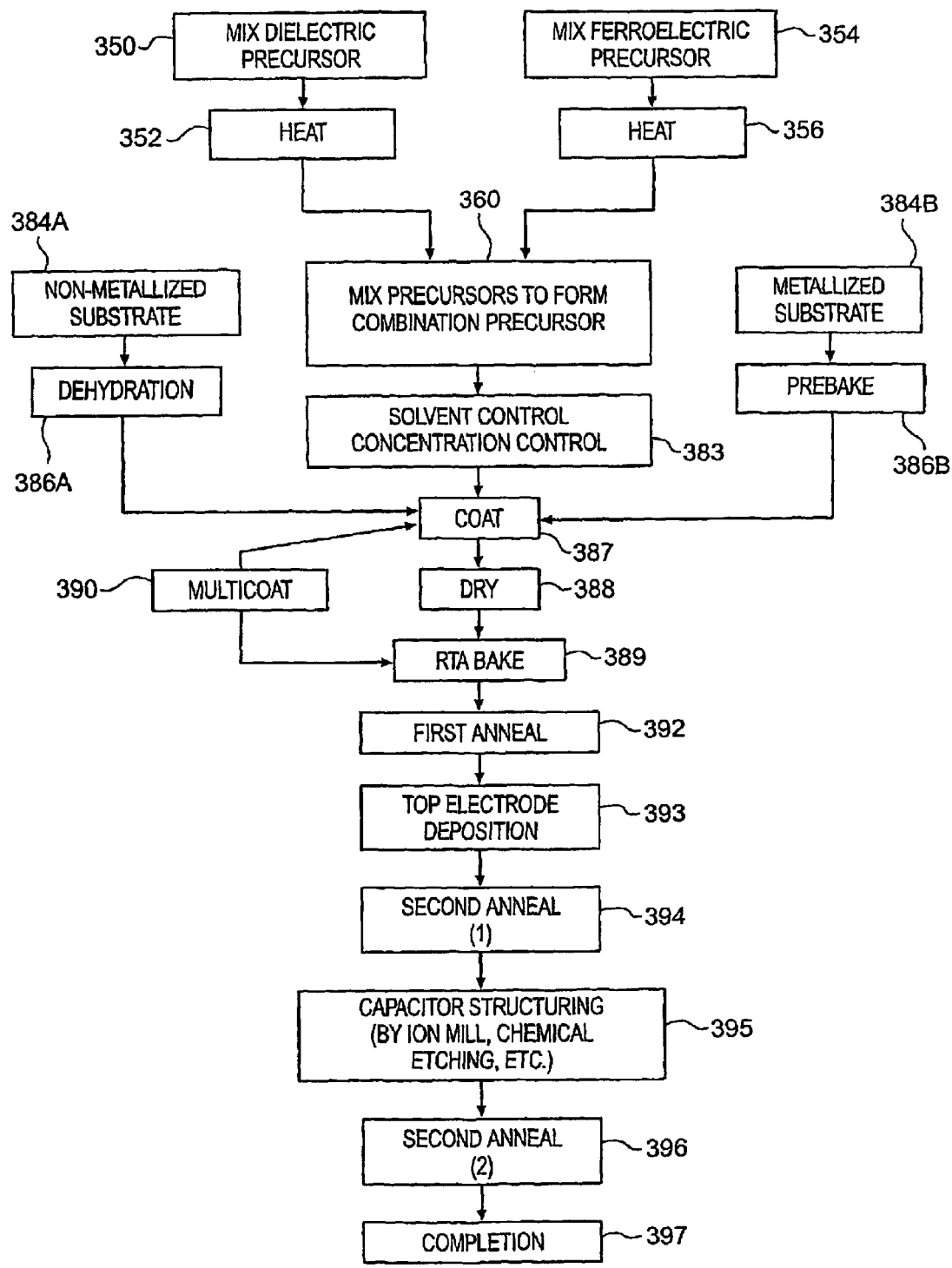
FIG. 10 is a flow chart of a preferred method of making a capacitor according to the invention.

As mentioned above, the composite ferroelectric is preferably made by a liquid deposition process. The liquid deposition process starts with preparation of appropriate precursor liquids. Preferably, the precursor for the dielectric material, i.e., the initial dielectric precursor, and the precursor for the ferroelectric material, i.e., the initial ferroelectric precursor, are made in separate containers. Referring to FIG. 10, the fluxor precursor, which is preferably a dielectric precursor, is mixed and heated in steps 350 and 352, respectively, though these can be done at the same time. Likewise, the ferroelectric precursor is mixed and heated in steps 354 and 356, respectively, though these can be done at the same time. The heating step is showed separately for the dielectric and ferroelectric precursors because, in one preferred embodiment, the heating is separate for each or the two precursors. The separate heating steps result in the elements for the dielectric precursor to be formed into the organic precursor molecules in close-proximity, while the elements for the ferroelectric precursor are formed in other organic precursor molecules in close proximity. For example, for a layered superlattice material or an $ABO_3$ type material, step 350 preferably comprises providing a plurality of polyoxyalkylated metal moieties including at least one A-site metal and at least one B-site metal. It is to be understood that the terms "A-site metal" and "B-site metal" refer to metals that are suitable for use in a perovskite-like lattice, but do not actually occupy A-site and B-site positions in solution. The respective metal moieties are combined in effective amounts for yielding, upon crystallization of the precursor solution, a dielectric material. Likewise, for a layered superlattice material or an $ABO_3$ type material, step 354 preferably comprises providing a plurality of polyoxyalkylated metal moieties including at least one A-site metal and at least one B-site metal, but in this case, he respective metal moieties are combined in effective amounts for yielding, upon crystallization of the precursor solution, a ferroelectric material. The mixing step preferably includes mixing the respective metal moieties to substantial homogeneity in a solvent.

As indicated in the example above, in the preferred embodiment the precursors are liquids in which a compound or compounds of the metals to comprise the thin film layer 15, 55, 124 of the composite material are dissolved. If separate dielectric and ferroelectric precursors are made, the precursors are then mixed in step 360 to form the combined precursor. In another preferred embodiment, the combination precursor is formed in a single container, and the various ingredients are heated together. As an example of such a process, one of either the A-site or B-site elements of either a desired layered superlattice material or a desired $ABO_3$ type material, that can be either the ferroelectric or a dielectric in the composite material, is added to the precursor in an amount far in excess of the amount that can be held in solution in the desired material. Upon depositing and heating of the combined precursor, the excess material precipitates out to form the other material of the composite. That is, if the desired material is the ferroelectric, then the material that precipitates out will be the dielectric, and if the desired material is the dielectric material, the material that precipitates out will be the ferroelectric. The drying step 399, the RTA bake 389, and the annealing steps 392, 394, and 396 individually or in any combination with one another are preferably controlled to allow the ferroelectric material to crystallize before the dielectric material, thereby creating ferroelectric precipitate within the dielectric matrix. The ferroelectric grains are isolated by the dielectric materials. Then, in some embodiments, there follows a solvent control and/or concentration control step 383. Generally this step is taken over two stages which may be separated considerably in time. In the first stage the mixed precursor is dissolved in a suitable solvent and concentrated so as to provide a long shelf life. Just before use, the solvent and concentration may be adjusted to optimize the electronic device that results from the process. The final precursor contains metal moieties in effective amounts for spontaneously forming the desired composite material upon drying and heating the final precursor.

In parallel with either the combined precursor formation step 360 or the solvent and concentration control step 383, the substrate 14, 53, 122 is prepared. If the substrate is a metallized substrate, such as the substrate 14, then the substrate is provided in step 384A by forming the layers 12, 13, and 14 and is then prebaked in step 386A. If the substrate is a non-metallized substrate, such as a silicon or gallium arsenide single crystal, the substrate is provided in step 384B and dehydrated in step 386B. In step 387 the substrate is coated with the precursor. In the examples discussed below, the coating was done by a spin-on process, though a process such as a misted deposition process as described in U.S. Pat. No. 5,540,772, or dipping or other suitable coating process may be used. The coated substrate is then dried in step 388, and then baked in an RTP (rapid thermal processor) unit. If the desired thickness of the layer 15, 55, 124 is not obtained, then the series of coat, dry, and RTP bake steps 87, 88, and 89 are repeated as many times as required to build-up the desired thickness. However, in the preferred embodiment, only one layer is formed. The wafer 10, 40, 100 is then annealed in step 392, the top electrode 16, 126, or gate 58 is deposited in step 93 by sputtering or other suitable process, and the wafer is then, optionally, annealed again in step 394. The capacitor 17, 128 or gate structure 50 is then structured by ion milling, chemical etching, or other suitable process in step 395. Then follows, in step 396, a second "second anneal" step, which will be the third anneal if step 394 was done. This completes the process if a capacitor device as in FIG. 1 is the desired end result; however, in the case of an integrated circuit as in FIGS. 3–5, there follows completion steps 397 such as contact metallization, capping, etc. As will be discussed further below, not all of the steps outlined above are necessary for every device; some steps are optional and others are used only for certain materials.

Examples of initial precursor solutions and their preparation in step 350 and 354 are discussed in detail in U.S. Pat. No. 5,423,285. Generally a metal or a metal compound is reacted with a carboxylic acid, such as 2-ethylhexanoic acid, to produce a metal hexanoate, which is dissolved in a suitable solvent or solvents, such as xylenes. Other metal-organic acid esters in addition to the 2-ethylhexanoates that may be used for suitable precursors when compounded with a metal are the acetates and acetylacetonates. For some metals, such as titanium, the precursor metal compound may comprise a metal alkoxide, such as titanium 2-methoxyethoxide. Other alkoxides that may be compounded with a metal and used as precursor compounds include the methoxides, ethoxides, n-propoxide, iso-propoxides, n-butoxides, iso-butoxides, tert-butoxides, 2-methoxyethoxides, and 2-ethoexyethoxides. The precursor metal compound is preferably dissolved in a solvent having a boiling point greater than the boiling point of water, i.e., 100° C. This, in combination with the heating steps in making the precursor, which preferably are performed at temperatures of 115° C. and higher, results in a precursor that is essentially anhydrous. A xylenes solvent works for most metals. For highly electropositive elements, the solvent preferably includes 2-methoxyethanol or n-butyl acetate. Some solvents that may be used, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones such as 2-hexanone (methyl butyl ketone) (127° C.), 4-methyl-2-pentanone (methyl isobutyl ketone) (118° C.), 3-heptanone (butyl ethyl ketone) (123° C.), and cyclo-hexanone (156° C.); esters, such as butyl acetate (127° C.), 2-methoxyethyl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.-143° C.), toluene (111° C.) and ethylbenzene (136° C.).

For either the dielectric precursor of step 350 or the ferroelectric precursor of step 354, or the combined precursor of step 360 in the example utilizing excess A-site or B-site given above, the precursors of the individual metals may be made separately and then mixed, but generally they are all made together in the same container and mixed as they are made. After mixing, the precursor solution may be distilled to remove water and other undesirable impurities and by-products of the preparation process, although if the precursors and solvents are commercially available in pure enough states, the heating steps may be skipped. The solvent type and concentration may then be adjusted in step 383 either to prepare it for coating, if the coating is to be done immediately, or to provide a precursor with a long shelf life. If the solvent control steps are such as to prepare a solution with a long shelf life, then just before coating, another adjustment will usually be done to optimize the thin film. Some adjustments to produce a long shelf life and to produce high quality films are discussed in detail in U.S. Pat. No. 5,423,285. These may include a solvent exchange step and/or the addition of a co-solvent to provide a solvent that produces a better quality film than the solvent in which the precursor was stored.

In steps 384A and 386A, or steps 384B and 386B, a substrate is provided and prepared for coating. Almost any substrate that will support a thin film and is compatible with the materials and processes described herein may be used. Some of these substrates include oxidized or non-oxidized silicon or gallium arsenide semiconducting wafers, with or without integrated circuits and/or metallized layers added, plates of silicon or glass, and other electronic device chips. For the exemplary devices of this disclosure, the substrates were metallized substrates 14 as shown in FIG. 1. The fabrication of the substrate 14 is described in detail in U.S. Pat. No. 5,423,285 referred to above, and will not be repeated herein. While platinum with a titanium adhesion layer, or platinum alone, are the metallizations used in the examples discussed, numerous other metals may be used such as platinum with an adhesion layer of tantalum, tungsten, molybdenum, chromium, nickel or alloys of these metals, and titanium nitride. Sputtering or vacuum deposition is the preferred deposition process, though other metallization processes may be used. Heating of the substrates during the metallization deposition is effective to increase adhesion.

The precursor mixing, heating, mixing, and concentration control steps 350, 352, 354, 356, 360, and 83 have been discussed separately and linearly for clarity. However, these steps can be combined and/or ordered differently depending on the particular liquids used, whether one intends to store the precursor or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 14, 53, 124. Preferably, the coating is done by a spin-on process. The preferred precursor solution concentration is 0.01 to 0.50 M (moles/liter), and the preferred spin speed is between 500 rpm and 5000 rpm.

The spin-on process and the misted deposition process remove some of the solvent, but some solvent remains after the coating. This solvent is removed from the wet film in a drying step 388. At the same time, the heating causes thermal decomposition of the organic elements in the thin film, which also vaporize and are removed from the thin film. This results in a solid thin film of the composite material 15, 55, 124 in a precrystallized amorphous state. This dried film is sufficiently rigid to support the next spin-on coat if a second coat is used. The drying temperature must be above the boiling point of the solvent, and preferably above the thermal decomposition temperature of the organics in precursor solution. The preferred drying temperature is between 150° C. and 400° C. and depends on the specific precursor used. The drying step may comprise a single drying step at a single temperature, or multiple step drying process at several different temperatures, such as a ramping up and down of temperature. The multiple step drying process is useful to prevent cracking and bubbling of the thin film which can occur due to excessive volume shrinkage by too rapid temperature rise. An electric hot plate is preferably used to perform the drying step 388.

The drying step 388 is preferably followed by an RTP bake step 389. Radiation from a halogen lamp, an infrared lamp, or an ultraviolet lamp provides the source of heat for the RTP bake step. Preferably, the RTP bake is performed in an oxygen atmosphere of between 20% and 100% oxygen, at a temperature between 350° C. and 650° C., and preferably 600° C., with a ramping rate between 1° C./sec and 200° C./sec, and with a holding time of 5 seconds to 300 seconds. Any residual organics are burned out and vaporized during the RTP process. At the same time, the rapid temperature rise of the RTP bake promotes nucleation; i.e., the generation of numerous small crystalline grains of the layered composite material in the solid film. These grains act as nuclei upon which further crystallization can occur.

Once the desired film thickness has been obtained, the dried and preferably baked film is annealed in step 392, which is referred to as a first anneal to distinguish it from subsequent anneals. The first anneal is preferably performed in an oxygen atmosphere in a furnace. The oxygen concentration is preferably 20% to 100%, and the temperature is between 400° C. and 600° C., and preferably 550° C. or lower. The numerous nuclei, small grains generated by the RTP bake step, grow, and a well-crystallized ferroelectric film is formed under the oxygen-rich atmosphere.

After the first anneal, the second or top electrode 16, 126 or the gate electrode 58 is formed. Preferably, the electrode is formed by RF sputtering of a platinum single layer, but it also may be formed by DC sputtering, ion beam sputtering, vacuum deposition or other appropriate deposition process. If desirable for the electronic device design, before the metal deposition, the composite material 15 may be patterned using conventional photolithography and etching, and the electrode 16, 126, 58 is then patterned in a second process after deposition.

The wafer 10, 40, 100 including the composite 15, 55, 124 covered by electrode 16, 58, 126 may be annealed before the patterning step 95 described above in a heat treatment designated in FIG. 7 as the second anneal (1) step 394, after the patterning step 395 by a heat treatment designated in FIG. 7 as the second anneal (2) step 396, or both before and after the patterning step 395. The second anneal is preferably performed in an electric furnace at a temperature between 400° C. and 600° C., preferably, 550° C. or less.

The second anneal releases the internal stress in the top electrode 16, 58, 124 and in the interface between the electrode 15, 58, 124 and the composite material 15, 55, 124. At the same time, the second annealing step 394 or 396 reconstructs microstructure in the composite resulting from the sputtering of the top electrode, and as a result improves the properties of the material.

Figure 6:
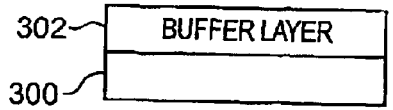
FIGS. 6–8 illustrate one alternative of a process for making a composite capacitor according to the invention.
Figure 7:
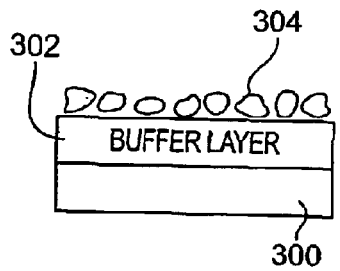
Figure 8:
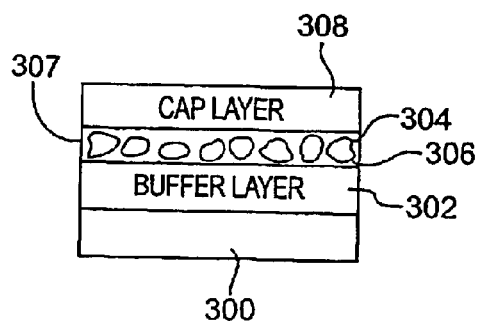

FIGS. 6–8 illustrate an preferred embodiment for microscopically growing a composite material on top of the substrate according to the invention. Buffer layer 302 is formed on top of substrate 300. Then a liquid precursor for the composite is applied to the substrate as described above. Buffer layer 302 serves as a seed layer which enhances the growth of ferroelectric islands 304. That is, as the liquid precursor is heated, an island growth of ferroelectric material component 304 begins to form, followed by the formation of a matrix 306 of the dielectric material component of the microscopically composite material 307. Then buffer layer 308 is formed on top of the microscopically composite material 307. The seed layer comprises a non-ferroelectric, dielectric material. Preferably, the seed layer is selected from the group consisting of a metallic oxide having a perovskite or ilmenite crystal structure and a dielectric constant of approximately 20 or higher. A partial list of such seed layer materials includes: zirconium titanate, lead lanthanum zirconium titanate, barium strontium titanate, lead oxide, germanium oxide, lead germanium oxide, organic materials comprising high dielectric constant polymers and bismuth layered superlattice materials.

3. Examples of the Fabrication Process and Property Dependence

EXAMPLE 1

Ferroelectric Material—Strontium Bismuth Tantalate Dielectric Material—Tantalum Pentoxide As a first example, to 250 ml of a commercially available precursor for strontium bismuth tantalate there is added approximately 40 grams of tantalum pentabutoxide, 70 grams of 2-ethylhexanoic acid, and 40-ml of xylenes. The flask was covered with a 50 ml beaker to assist in refluxing and to isolate the contents from atmospheric water. The mixture was refluxed with magnetic stirring on a 160° C. hot plate for 48 hours to form a substantially homogenous solution including butanol and tantalum 2-ethylhexanoate. It should be understood that the butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation of the butanol fraction and water to eliminate the same from solution. The flask was removed from the hot plate when the solution first reached a temperature of 124° C., which indicated that substantially all butanol, ether, and water had exited the solution. The flask and its contents were cooled to room temperature. The precursor was the used to form a microscopically composite ferroelectric thin film of a strontium bismuth tantalate ferroelectric in a tantalum pentoxide matrix as described above.

EXAMPLE 2

Ferroelectric Material—Strontium Bismuth Tantalate Dielectric Material—PbO/GeO$_2$ and Others As another example, precursors were formed as discussed above for 50%/50% composite of a PbO/GeO$_2$ fluxor with a strontium bismuth tantalate ferroelectric, which produced a ferroelectric composite material having a polarizability of about 7 microcoulombs/cm$^2$ at an anneal temperature of 500° C. Other fluxors combined with either strontium bismuth tantalate or strontium bismuth niobium tantalate were GeO$_2$, B$_2$O$_3$, BaO/2B$_2$O$_3$, PbO/2B$_2$O$_3$ and B$_2$O$_3$/GeO$_2$. It was found that the ratio of fluxor to ferroelectric could be varied from about 20%/80% ratio to about 80%/20% ratio and still get useable composite materials. Good results were also obtained with silicon oxide and germanium oxide as the fluxor, both by themselves, together, and combined with other simple oxides.

EXAMPLE 3

Ferroelectric Material—Strontium Bismuth Tantalate Fluxor Material—Silicon Dioxide As a third example, to 250 ml of a commercially available precursor for strontium bismuth tantalate there is added approximately 40 grams of tantalum pentabutoxide, 70 grams of 2-ethylhexanoic acid, and 40 ml of xylenes. The flask was covered with a 50 ml beaker to assist in refluxing and to isolate the contents from atmospheric water. The mixture was refluxed with magnetic stirring on a 160° C. hot plate for 48 hours to form a substantially homogenous solution including butanol and tantalum 2-ethylhexanoate. It should be understood that the butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation of the butanol fraction and water to eliminate the same from solution. The flask was removed from the hot plate when the solution first reached a temperature of 124° C., which indicated that substantially all butanol, ether, and water had exited the solution. The flask and its contents were cooled to room temperature. The precursor was then used to form a microscopically composite ferroelectric thin film as described above.

The concentration was 0.102 moles of SrBi$_2$Ta$_2$O$_9$ per liter. Then SiO$_2$ was mixed with the SrBi$_2$Ta$_2$O$_9$ solution on a 50%/50% basis. The wafer was baked at 140° C. in air for 30 minutes to dehydrate it. An eyedropper was used to place 1 ml of the SrBi$_2$Ta$_2$O$_9$/SiO$_2$ solution on the dielectric and non-ferroelectric material 123, as mentioned above. The wafer was spun at 1500 RPM for about 3 minutes. The wafer was then placed on a hot plate and baked at about 250° C. in air for three minutes. The steps from using an eyedropper to deposit solution on the wafer through baking on the hot plate were repeated for another layer. The wafer was then transferred to a rapid thermal processing (RTP) oven where rapid thermal processing was performed at 650° C. for 30 seconds in oxygen. Then the wafer was then transferred to an annealing oven where the wafer was annealed in oxygen at a temperature of 650° C. for one hour. After the annealing step, an integrated circuit capacitor was completed, i.e. a second platinum electrode was sputtered on and the wafer was then etched using well-known photo-resist techniques to produce a plurality of capacitors electrically connected via bottom electrode.

EXAMPLE 4

Ferroelectric Material—Lead Lanthanum Zirconate Tantalate Fluxor Material—Lead Lanthanum Zirconate Tantalate A process similar to the process of Example 1 was performed except that a commercially available PLZT precursor was used to which was added additional lanthanum 2-ethylhexanoate. A composite dielectric was formed by applying the precursor to a PLZT buffer layer 302 as described in connection with FIGS. 6–8 and drying, baking and annealing it as described in connection with FIG. 10. The extra lanthanum causes a dielectric matrix material to be formed at a temperature slightly different than a ferroelectric precipitate, which precipitate has a lower concentration of La than the dielectric material.

EXAMPLE 5

Ferroelectric Material—Lead Zirconate Tantalate Fluxor Material—Titanium Oxide

A commercial solution of 0.100 molar TiO$_2$ was purchased and mixed with a commercial PZT solution in a ratio of 50%/50%. The wafer was baked at 140° C. in air for 30 minutes to dehydrate it. An eyedropper was used to place 1 ml of the TiO$_2$/PZT solution on the dielectric and non-ferroelectric material 123, as mentioned above. The wafer was spun at 1500 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then transferred to a rapid thermal processing (RTP) oven where rapid thermal processing was performed at 725° C. for 30 seconds in oxygen. Then the wafer was then transferred to an annealing oven where the wafer was annealed in oxygen at a temperature of 700° C. for one hour. After the annealing step, an integrated circuit capacitor was completed, i.e. a second platinum electrode was sputtered on and the wafer was then etched using well-known photo-resist techniques to produce a plurality of capacitors electrically connected via bottom electrode.

It was found that the ratio of fluxor to ferroelectric could be varied from about 20%/80% ratio to about 80%/20% ratio and still get useable composite materials.

EXAMPLE 6

Ferroelectric Material—Strontium Bismuth Tantalate Fluxor Material—Low Viscosity Epoxy Glue An approximately 0.100 molar solution of strontium bismuth-tantalate was prepared according to Example 1 above and mixed with a low viscosity epoxy resin in a ratio of 50%/50%. The wafer was baked at 140° C. in air for 30 minutes to dehydrate it. An eyedropper was used to place 1 ml of the SBT/Epoxy resin on the dielectric and non-ferroelectric material 123, as mentioned above. The wafer was spun at 1500 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then thermally treated as in Example 3. Then the integrated circuit capacitor was completed as in Example 5

A feature of the invention is that by combining a precursor for a material that has a crystal growth velocity that is higher than the crystal growth velocity of a basic ferroelectric material with a precursor for the ferroelectric material, the ferroelectric material can be formed at a much lower crystallization temperature than without the fluxor. It is a feature of the invention that the thermal budget for drying, baking and annealing the ferroelectric thin film is much smaller than the thermal budget for prior art ferroelectric thin films.

There have been described what are, at present, considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Many other ferroelectric FET structures can be used in combination with the addressing scheme shown, for example, MFISFET structures. Further, now that the possibility and advantages of a ferroelectric memory utilizing the material according to the invention has been disclosed, the material may be used with any form of ferroelectric memory. The present embodiments are, therefore, to be considered as illustrative and not restrictive. The scope of the invention is indicated by the appended claims.

We claim:

1. A ferroelectric memory comprising a plurality of memory cells each containing a ferroelectric device including a composite material comprising matrix component comprising a dielectric material and ferroelectric component comprising microscopic domains dispersed in said matrix, said dielectric component being a different chemical compound than said ferroelectric component.

2. A ferroelectric memory as in claim 1 wherein said ferroelectric component comprises a layered superlattice material.

3. A ferroelectric memory as in claim 1 wherein said dielectric component comprises a material selected from the group consisting of $B_2O_3$, $SiO_2$, $GeO_2$, $P_2O_5$, $As_2O_3$, $Sb_2O_3$, $In_2O_3$, $Tl_2O_3$, $SnO_2$, $PbO$, $SeO_2$, $TeO_2$, $MoO_3$, $WO_3$, $Bi_2O_3$, $Al_2O_3$, $Ba_2O_3$, $V_2O_5$, $MgO$, $SO_3$, $CaO$, $ZnO$, $BeO$, $Rb_2O$, $La_2O_3$, $ThO_2$, $Ta_2O_5$ and $Ti_2O$, solid solutions thereof, $ABO_3$ type oxides, layered superlattice materials, and polymides.

4. A ferroelectric memory as in claim 1 wherein said ferroelectric component comprises an $ABO_3$ type material.

5. A ferroelectric memory as in claim 1 wherein said matrix component is selected from the group consisting of: silicon dioxide, bismuth oxide, strontium tantalate, bismuth tantalate, lead germanate, and $ABO_3$ non-ferroelectric dielectric material, and combinations thereof, and said ferroelectric component is selected from the group consisting of: layered superlattice materials and $ABO_3$ type ferroelectric materials.

6. A ferroelectric memory as in claim 1 wherein said matrix component is selected from the group consisting of: non-ferroelectric dielectric PZT and PLZT, and said ferroelectric component is selected from the group consisting of: ferroelectric PZT and PLZT.

7. A ferroelectric m mory as in claim 1 wherein said matrix component is selected from the group consisting of lead titanate and lead tantalate, and said ferroelectric component is selected from the group consisting of layered superlattice materials and $ABO_3$ type materials.

8. A ferroelectric memory as in claim 1 wherein said matrix component is selected from the group consisting of: non-ferroelectric, dielectric, bismuth layered perovskites and said ferroelectric component is selected from the group consisting of: ferroelectric bismuth layered perovskites.

9. A ferroelectric memory as in claim 8 wherein said non-ferroelectric dielectric material comprises a material selected from the group consisting of $Bi_2(Mo,W)O_6$, $Bi_3Ti(Ta,Nb)O_9$, $Bi_2TaO_6$ and $CaBi_2Ta_2O_9$.

10. A ferroelectric memory as in claim 1 wherein said dielectric, component has a higher dielectric constant than said ferroelectric component.

11. A ferroelectric memory as in claim 1, 2, 3, 4, 5, 6, 7, 8, or 9 wherein said ferroelectric device is a ferroelectric capacitor.

12. A ferroelectric memory as in claim 1, 2, 3, 4, 5, 6, 7, 8, or 9 wherein said ferroelectric device is a ferroelectric field effect transistor (FeFET).

13. A ferroelectric memory as in claim 1, 2, 3, 4, 5, 6, 7, 8, or 9 wherein said dielectric component is a fluxor.

14. A ferroelectric memory as in claim 1, 2, 3, 4, 5, 6, 7, 8, or 9 wherein said ferroelectric component has a lower crystallization temperature than said dielectric component.

* * * * *